(12) United States Patent
Egami et al.

(10) Patent No.: US 8,686,101 B2
(45) Date of Patent: Apr. 1, 2014

(54) COATING LIQUID FOR FORMING LOW DIELECTRIC CONSTANT AMORPHOUS SILICA-BASED COATING FILM AND THE COATING FILM OBTAINED FROM THE SAME

(75) Inventors: Miki Egami, Kitakyushu (JP); Hiroki Arao, Kitakyushu (JP); Akira Nakashima, Kitakyushu (JP); Michio Komatsu, Kitakyushu (JP)

(73) Assignee: JGC Catalysts and Chemicals Ltd., Kanagawa (JP)

( * ) Notice: Subject to any disclaimer, the term of this patent is extended or adjusted under 35 U.S.C. 154(b) by 564 days.

(21) Appl. No.: 12/086,745

(22) PCT Filed: Dec. 15, 2006

(86) PCT No.: PCT/JP2006/325026
§ 371 (c)(1),
(2), (4) Date: Jun. 19, 2008

(87) PCT Pub. No.: WO2007/072750
PCT Pub. Date: Jun. 28, 2007

(65) Prior Publication Data
US 2009/0025609 A1 Jan. 29, 2009

(30) Foreign Application Priority Data
Dec. 22, 2005 (JP) .................................. 2005-371017

(51) Int. Cl.
*C08G 77/08* (2006.01)
(52) U.S. Cl.
USPC ............................................ 528/21; 528/39
(58) Field of Classification Search
USPC ...................................................... 528/21, 39
See application file for complete search history.

(56) References Cited

U.S. PATENT DOCUMENTS

| | | | |
|---|---|---|---|
| 6,800,330 B2 | 10/2004 | Hayashi et al. | |
| 2002/0020327 A1* | 2/2002 | Hayashi et al. | 106/287.12 |
| 2004/0109950 A1 | 6/2004 | Adams et al. | |
| 2004/0180222 A1 | 9/2004 | Ogihara et al. | |

FOREIGN PATENT DOCUMENTS

| | | |
|---|---|---|
| JP | 06 173054 | * 6/1994 |
| JP | 09-315812 | 12/1997 |
| JP | WO/00/12640 | 3/2000 |
| JP | WO/00/18847 | 4/2000 |
| JP | 2000-349083 | 12/2000 |
| JP | 2001-354904 | 12/2001 |
| JP | 2002-030249 | 1/2002 |
| JP | 2002-038090 | 2/2002 |
| JP | 2003-041191 | 2/2002 |
| JP | 2002-211917 | 7/2002 |
| JP | 2002-285086 | 10/2002 |
| JP | 2003-064305 | 3/2003 |
| JP | 2004-149714 | 5/2004 |
| JP | 2004-153147 | 5/2004 |
| JP | 2004-269692 | 9/2004 |
| JP | 2005-133040 | 5/2005 |
| JP | 2005-327757 | 11/2005 |

OTHER PUBLICATIONS

JP 06 173054 machine translation (1994).*
Ex parte Malz (Bd. Pat. App. & Int. 2010)(Appeal No. 2009-95123).*
Zeolite with Organic group as Lattice by Katsutoshi Yamamoto and Takashi Tatsumi Chemical Industry, 57(5), (2004)512-514.

* cited by examiner

*Primary Examiner* — Kuo-Liang Peng
(74) *Attorney, Agent, or Firm* — Leydig, Voit & Mayer, Ltd.

(57) ABSTRACT

A coating liquid for forming a low dielectric constant amorphous silica-based coating film with a dielectric constant of 3.0 or below and a film strength (Young's modulus) of 3.0 GPa or more, and also having a smooth surface with an excellent hydrophobicity. The coating liquid contains (1) a silicon compound obtained by hydrolyzing bis(trialkoxysilyl)alkane (BTASA) and alkoxysilane (AS) in the presence of tetraalkylammoniumhydroxide (TAAOH), or (2) a silicon compound obtained by hydrolyzing bis(trialkoxysilyl)alkane (BTASA), alkoxysilane (AS) and tetraalkylorthosilicate (TAOS) in the presence of tetraalkylammoniumhydroxide (TAAOH).

14 Claims, 1 Drawing Sheet

COATING LIQUID FOR FORMING LOW DIELECTRIC CONSTANT AMORPHOUS SILICA-BASED COATING FILM AND THE COATING FILM OBTAINED FROM THE SAME

TECHNICAL FIELD

The present invention relates to a coating liquid for forming, on a substrate, a low dielectric constant amorphous silica-based coating film with the dielectric constant of 3.0 or below, more specifically 2.5 or below and also having a high film strength and an excellent hydrophobic property with its surface being smooth or even, and further relates to a low dielectric constant amorphous silica-based coating film obtained from the coating liquid.

BACKGROUND TECHNOLOGY

In association with the recent tendency for a higher degree of integration in a semiconductor device having multilayered metal wirings designed under a rule of 0.25 micron or below, as a clearance between the metal wiring layers has become increasingly smaller, impedance between the metal wirings increases due to electrostatic induction, which may lead to some disadvantageous results such as a delay in a response speed or increase of power consumption. To overcome this problem, it is required to make as much as lower a dielectric constant of an interlayer insulating film which is provided between the metal wirings made of aluminum or copper, on a semiconductor substrate.

The interlayer insulating film provided for the purpose as described above is generally formed on a semiconductor substrate by using the vapor-phase growth method such as the CVD (Chemical Vapor Deposition) method, or the coating method such as the spin coating method.

By using the latest technique based on the CVD method (as described, for instance, in Patent 1), it is possible to obtain a silica-based coating film with the dielectric constant of 3 or below, but it is generally considered that it is difficult to form a CVD insulating film with the dielectric constant of 2.5 or below, and also like in the coating method based on the conventional technology, there is the problem that, as a dielectric constant of the film becomes lower, strength of the film becomes lower. Furthermore, in the CVD insulating films made of a polyallyl resin, a fluorine-added polyimide resin, or a fluorine resin, or in a coating film formed with a coating liquid of any of such resin materials, the dielectric constant may be around 2, but the adhesiveness to a surface of a semiconductor substrate and also to a resist material used in micro-fabrication are low, and furthermore there is also the problem that the chemical resistance and the resistance against oxygen plasma are disadvantageously low.

In the coating films obtained by using a coating liquid for forming a silica-based coating film containing partial hydrolysate or hydrolysate of alkoxysilane and/or halogenated silane, although it is possible to obtain a coating film with the dielectric constant of 3 or below, it is difficult to achieve the dielectric constant of 2.5 or below, and there is also the problem, for instance, that the adhesiveness to a coated surface is low.

The present inventors made intensive researches for solving the problems as described above, and it is possible to form a coating film with the dielectric constant of 3 or below, which is excellent in adhesiveness to a coated surface, film strength, chemical resistance such as resistance against alkali, cracking resistance, and surface flatness and also which is excellent in resistance against oxygen plasma and workability of etching, by using a) a coating liquid for forming a low dielectric constant silica-based coating film, containing polysiloxane which is a product between alkoxysilane and/or halogenated silane or hydrolysate of any of the materials and fine silica particles (as described, for instance, in Patent document 2); b) a coating liquid for forming a low dielectric constant silica-based coating film, containing alkoxysilane and/or halogenated silane or hydrolysate of any of the materials and an easily decomposable resin which is decomposed or vaporized at 500° C. or below (as described, for instance, in Patent document 3), c) a coating liquid for forming a low dielectric constant silica-based coating film, containing polysiloxane which is a product between alkoxysilane and/or halogenated silane or hydrolysate of any of the materials and fine silica particles and an easily decomposable resin which is decomposed or vaporized at 500° C. or below (as described, for instance, in Patent document 4), or d) a coating liquid for forming a low dielectric constant silica-based coating film, containing alkoxysilane and/or halogenated silane or hydrolysate of any of the materials and an organic template material (as described, for instance, in Patent document 5).

However, the present inventors repeated a lot of examinations for forming a low dielectric constant silica-based coating film on various types of semiconductor substrates by using the coating liquids as described above and known methods for forming a coating film (such as the spin coating method or other coating method) and found that, although a coating film having the characteristics as described above could be obtained, strength of the coating film became lower when it was tried to form a coating film having a dielectric constant of 2.5 or below, and also that it was difficult to stably obtain a coating film having the Young's modulus of at least 3.0 GPa (Giga Pascal) or more as required by the semiconductor device manufacturers.

On the other hand, researchers in Tohoku University reported that it is possible to use an organic/inorganic hybrid zeolite having an organic group in the framework, which can provide a material for forming a coating film having a low dielectric constant, and that the material can be synthesized with bis(triethoxysilyl)methane (as described, for instance, in Non-patent document 1).

In relation to this report, there have been proposed a zeolite having an aliphatic group selected from the group consisting of alkylene, alkenylene, and alkadienylene in the framework as obtained by subjecting water and the organic silicon compound expressed by general formula (1) at a temperature from 80 to 260° C. and preferably from 90 to 220° C. to a hydrothermal reaction, and a method for synthesizing the zeolite (as described, for instance, in Patent document 6):

(1)

Although the coating film obtained from the above material has a high Young's modulus, there is a defect that the surface is substantially rough, because the particle size of the zeolite substances contained in the coating film is relatively large and around 20 nm. When an interlayer insulating film or the like is formed with the material, complicated operations such as a chemical and mechanical polishing are required to make a surface of the coating film smooth.

As a composition for forming a coating film having a low dielectric constant and a high adhesiveness, there have been proposed, for instance, a composition for forming a coating film containing a hydrolyzed condensate obtained by hydrolytic condensation of, for instance, the silane compound A expressed by general formula (2) and the silane compound B expressed by general formula (3) (wherein $R_y$ denotes a bivalent organic group having a double bond of carbon or a triple bond of carbon, and a laminated film formed with the composition:

(2)

(3)

However, because $R_y$ constituting the silane compound B is a bivalent organic group having a double bond or a triple bond of carbon, when the composition for forming a coating film is thermally cured, the composition reacts to a polymer (for instance, an organic polymer) in other films contacting the silica-based film, and adhesiveness with the other film is improved, but the use for such purpose as described above is rather a rare case. When the composition is used for other purposes, there may occur some troubles such as deterioration in resistance against plasma or heat resistance of the coating film.

The inventors made keen efforts for solving the problems as described above, and found that the problems can be solved by forming a coating film on a substrate by using a coating liquid for forming a coating film, having a novel composition and novel characteristics as described below, and completed the present invention.
Patent document 1: JP2000-349083A
Patent document 2: JPH09-315812A
Patent document 3: WO00-18847A
Patent document 4: WO00-12640A
Patent document 5: JP2002-30249A
Patent document 6: JP2002-211917A
Patent document 7: JP2005-133040A
Non patent document 1: "Novel organic-inorganic hybrid zeolite having an organic group in the framework", Chemistry and Industries, Vol. 57, No. 5, p. 512 to p. 514 (2004)

DISCLOSURE OF THE INVENTION

The present invention was made to solve the problems as described above, and an object of the present invention is to provide a coating liquid for forming, on a substrate, a low dielectric constant amorphous silica-based coating film with the dielectric constant of 3.0 or below, more specifically of 2.5 or below and also having a high film strength with Young's modulus of 3.0 GPa or more and a smooth surface with an excellent hydrophobic property, and further relates to a low dielectric constant amorphous silica-based coating film obtained from the coating liquid.

The present invention provides a coating liquid for forming a low dielectric constant amorphous silica-based coating film which has smoothness of its surface, a high film strength and an excellent hydrophobicity, wherein the coating liquid contains a silicon compound obtained by hydrolyzing bis(trialkoxysilyl)alkane (BTASA) expressed by general formula (I) and alkoxysilane (AS) expressed by general formula (II) in the presence of tetraalkylammoniumhydroxide (TAAOH) at a temperature in the range from 40 to 80° C.:

(I)

(wherein $R^1$ denotes a methylene group, an ethylene group, or a propylene group; and $R^2$ to $R^7$, which may be identical or different, denotes a hydrogen atom, an alkyl group having 1 to 8 carbon atoms, a fluorine-substituted alkyl group, an allyl group, or a vinyl group), (II)

(wherein $R^8$ denotes a hydrogen atom, a fluorine atom, an alkyl group having 1 to 8 carbon atoms, a fluorine-substituted alkyl group, an allyl group, or a vinyl group; and $R^9$ denotes a hydrogen atom, an alkyl group having 1 to 8 carbon atoms, an allyl group, or a vinyl group, and n is an integer from 0 to 3.)

The present invention further provides a coating liquid for forming a low dielectric constant amorphous silica-based coating film which has smoothness of its surface, a high film strength and an excellent hydrophobicity, wherein the coating liquid contains a silicon compound obtained by hydrolyzing bis(trialkoxysilyl)alkane (BTASA) expressed by general formula (I) as described above, alkoxysilane (AS) expressed by general formula (II) as described above, and tetraalkyl orthosilicate (TAOS) in the presence of tetraalkylammoniumhydroxide (TAAOH) at a temperature in the range from 40 to 80° C.

The bis(trialkoxysilyl)alkane (BTASA) as described above is preferably to be bis(trimethoxysilyl)methane (BTMSM), bis(triethoxysilyl)methane (BTESM), bis(trimethoxysilyl)ethane (BTMSE), bis(triethoxysilyl)ethane (BTESE), or a mixture thereof.

Furthermore the alkoxysilane (AS) as described above is preferably to be methyltrimethoxysilane (MTMS), methyltriethoxysilane (MTES), or a mixture thereof.

The tetraalkylammoniumhydroxide (TAAOH) as described above is preferably to be tetrapropylammoniumhydroxide (TPAOH), tetrabutylammoniumhydroxide (TBAOH), or a mixture thereof.

The tetraalkylammoniumhydroxide (TAAOH) contains impurities comprising compounds of alkali metal elements such as sodium (Na) and potassium (K), by preferably 50 ppb by weight or below on the respective element bases. Furthermore, the tetraalkylammoniumhydroxide (TAAOH) contains impurities comprising compounds of halogen group elements such as bromine (Br) and chlorine (Cl), by preferably 1 ppm by weight or below on the respective element bases.

The tetraalkylorthosilicate (TAOS) as described above is preferably to be tetraethylorthosilicate (TEOS), tetramethylorthosilicate (TMOS), or a mixture thereof.

The molar ratio (namely, BTASA/AS) of the bis(trialkoxysilyl)alkane (BTASA) to the alkoxysilane (AS) is preferably in the range from 7/3 to 3/7 in terms of $SiO_2$.

The molar ratio (namely, (BTASA+AS)/TAOS) of the sum of the bis(trialkoxysilyl)alkane (BTASA) and the alkoxysilane (AS) to the tetraalkylorthosilicate (TAOS) is preferably in the range from 99/1 to 50/50 in terms of $SiO_2$.

The molar ratio (namely, TAAOH/(BTASA+AS)) of the tetraalkylammoniumhydroxide (TAAOH) to the sum of the bis(trialkoxysilyl)alkane (BTASA) and the alkoxysilane (AS) is preferably in the range from 1/10 to 6/10 in terms of $SiO_2$ when only the BTASA and AS are converted to $SiO_2$.

The molar ratio (namely, TAAOH/(BTASA+AS+TAOS)) of the tetraalkylammoniumhydroxide (TAAOH) to the sum of the bis(trialkoxysilyl)alkane (BTASA), the alkoxysilane (AS) and the tetraalkylorthosilicate (TAOS) is preferably in the range from 1/10 to 6/10 in terms of $SiO_2$ when only the BTASA, AS and TAOS are converted to $SiO_2$.

The silicon compound as described above has a number average molecular weight being preferably in the range from 3,000 to 70,000 in terms of polyethyleneoxide.

The coating liquid as described above contains a silicon compound obtained by hydrolyzing the bis(trialkoxysilyl)alkane (BTASA) and the alkoxysilane (AS), or a silicon compound obtained by hydrolyzing the bis(trialkoxysilyl)alkane (BTASA), the alkoxysilane (AS) and the tetraalkyl orthosilicate (TAOS) in the range from 1 to 20% by weight, and other components thereof are substantially water and an organic solvent.

The organic solvent as described above is preferably to be propyleneglycolmonopropylether (PGP), propyleneglycolmonomethylether (PGME), or propyleneglycolmonomethyletheracetate (PGMEA).

The present invention provides an amorphous silica-based coating film with a low dielectric constant which is obtained by coating the above coating liquid on a substrate, heating the substrate at a temperature in the range from 80 to 350° C., and then curing the substrate at a temperature higher than the heating temperature in the range from 340 to 450° C.

The present invention further provides an amorphous silica-based coating film with a low dielectric constant which is obtained by coating the above coating liquid on a substrate, heating the substrate at a temperature in the range from 80 to 350° C., and then curing the substrate by irradiating electron beam, ultraviolet radiation or micro wave.

The coating film as described above preferably has a dielectric constant of 3.0 or below and a film strength with Young's modulus of 3.0 GPa or more. The coating film preferably has a smooth surface having a surface roughness (Rms) of 1.0 nm or below.

The coating film is preferably to be an amorphous silica-based coating film not having X-ray diffraction peaks showing the MFI crystal structure.

Further, a desirable use of the coating film is, for instance, for an interlayer insulating film formed on a semiconductor substrate.

The coating liquid according to the present invention can provide a low dielectric constant amorphous silica-based coating film with a dielectric constant of 3.0 or below, more specifically 2.5 or below, and having a high film strength with Young's modulus of 3.0 GPa or more and an excellent hydrophobic property (namely, resistance against water or water-vapor), which can be formed on a substrate.

The coating liquid according to the present invention can further provide a low dielectric constant amorphous silica-based coating film having a smooth surface with a surface roughness (Rms) of 1.0 nm or below without grinding the surface thereof, which can be formed on a substrate.

The silica-based coating film obtained by the coating liquid according to the present invention, in addition to the characteristic properties as described above, is excellent in adhesiveness to a surface of a substrate, on which the coating film is formed, such as a semiconductor substrate, a chemical resistance such as an alkali resistance and a cracking resistance, and further more, excellent in resistance against an oxygen plasma and in process adaptability such as an etching workability.

BEST MODE FOR CARRYING OUT THE INVENTION

The coating liquid according to the present invention and a low dielectric constant amorphous silica-based coating film formed from the coating liquid will be explained specifically.

[A Coating Liquid for Forming a Coating Film and the Preparation Method Thereof]

1. [Coating Liquid-A]

The first coating liquid according to present invention (namely, Coating Liquid-A) is a coating liquid for forming a low dielectric constant amorphous silica-based coating film having smoothness of its surface, a high film strength and an excellent hydrophobicity, which comprises;

a silicon compound obtained by hydrolyzing bis(trialkoxysilyl)alkane (BTASA) expressed by general formula (I) and alkoxysilane (AS) expressed by general formula (II) in the presence of tetraalkylammoniumhydroxide (TAAOH) at a temperature in the range from 40 to 80° C.:

(I)

(wherein $R^1$ denotes a methylene group, an ethylene group, or a propylene group; and $R^2$ to $R^7$, which may be identical or different, denotes a hydrogen atom, an alkyl group having 1 to 8 carbon atoms, a fluorine-substituted alkyl group, an allyl group, or a vinyl group), (II)

(wherein $R^8$ denotes a hydrogen atom, a fluorine atom, an alkyl group having 1 to 8 carbon atoms, a fluorine-substituted alkyl group, an allyl group, or a vinyl group; and $R^9$ denotes a hydrogen atom, an alkyl group having 1 to 8 carbon atoms, an allyl group, or a vinyl group, and n is an integer from 0 to 3.)

The bis(trialkoxysilyl)alkane (BTASA) includes, but not limited to, bis-(trimethoxysilyl)methane, bis(triethoxysilyl)methane, bis(tripropoxysilyl)methane, bis(trimethoxysilyl)ethane, bis(triethoxysilyl)ethane, bis(tripropoxysilyl)ethane, bis-(trimethoxysilyl)propane, bis(triethoxysilyl)propane and bis(tripropoxysilyl)propane. Of these, it is preferable to use bis(trimethoxysilyl)methane (BTMSM), bis(triethoxysilyl)methane (BTESM), bis(trimethoxysilyl)ethane (BTMSE), bis(triethoxysilyl)ethane (BTESE) or the mixture thereof.

The alkoxysilane (AS) includes, but not limited to, methyltrimethoxysilane, methyltriethoxysilane, methyltriisopropoxysilane, ethyltrimethoxysilane, ethyltriethoxysilane, ethyltriisopropoxysilane, octyltrimethoxysilane, octyltriethoxysilane, vinyltrimethoxysilane, vinyltriethoxysilane, phenyltrimethoxysilane, phenyltriethoxysilane, trimethoxysilane, triethoxysilane, triisopropoxysilane, fluorotrimethoxysilane, fluorotriethoxysilane, dimethyldimethoxysilane, dimethyldiethoxysilane, diethyldimethoxysilane, diethyldiethoxysilane, dimethoxysilane, diethoxysilane, difluorodimethoxysilane, difluorodiethoxysilane, trifluoromethyltrimethoxysilane and trifluoromethyltriethoxysilane. Of these, it is preferable to use methyltrimethoxysilane (MTMS), methyltriethoxysilane (MTES), or the mixture thereof.

The tetraalkyl ammonium hydroxide (TAAOH) includes, but not limited to, tetramethylammoniumhydroxide, tetraethylammoniumhydroxide, tetrapropylammoniumhydroxide, tetrabutylammoniumhydroxide, tetra-n-octylammoniumhydroxide, n-hexadecyltrimethylammoniumhydroxide and n-octadecyltrimethylammoniumhydroxide. Of these, it is preferable to use tetrapropylammoniumhydroxide (TPAOH), tetrabutylammoniumhydroxide (TBAOH), tetramethylammoniumhydroxide (TMAOH) or the mixture thereof.

It is generally known that some of the tetraalkylammoniumhydroxide (TAAOH) commercially available in the market for common usage contain compounds of alkaline metal elements such as sodium (Na) and potassium (K), and also compounds of halogen group elements such as bromine (Br) and chlorine (Cl) as impurities with a level in the range from hundreds ppm by weight to several percents by weight on the respective element bases.

However, if the impurities comprising compounds of alkaline metal elements such as sodium (Na) and potassium (K) are contained therein more than 50 ppb by weight on the respective element bases, they are diffused to a transistor composing a semiconductor substrate and may cause deterioration of the transistor.

And, if the impurities comprising compounds of halogen group elements such as bromine (Br) and chlorine (Cl) are contained therein more than 1 ppm by weight on the respective element bases, the aluminum wiring or copper wiring composing a semiconductor substrate are suffered from corrosion, and then this may give fatal damages to the substrate.

Moreover, if the compounds of alkaline metal elements as the impurities are contained therein more than 50 ppb by weight, the compounds act as catalyst when hydrolyzing the bis(trialkoxysilyl)alkane (BTASA) and the alkoxysilane (As), or the bis(trialkoxysilyl)alkane (BTASA), the alkoxysilane (AS) and the tetraalkylorthosilicate (TAOS) in the presence of tetraalkylammoniumhydroxide (TAAOH), and consequently the obtained silicon compound may become into a zeolite-like crystalline state. As a result, the coating film formed on a substrate by use of such a coating liquid would include zeolitic crystalline substances and a surface thereof becomes rough and may not obtain a smooth surface.

Accordingly, when the tetraalkylammoniumhydroxide (TAAOH) containing the above impurities, which is commercially available in the market, is used, it is necessary to remove such impurities to the level as described above. Namely, it is preferable to substantially remove from the tetraalkylammoniumhydroxide (TAAOH) the impurities comprising compounds of alkaline metal elements such as sodium (Na) and potassium (K), and also compounds of halogen group elements such as bromine (Br) and chlorine (Cl), by subjecting it into a cation-exchange resin treating process and an anion-exchange resin treating process.

The coating liquid-A according to the present invention is prepared with a molar ratio (BTASA/AS) of the bis(trialkoxysilyl)alkane (BTASA) to the alkoxysilane (AS) being preferably in the range from 7/3 to 3/7, more preferably in the range from 6/4 to 4/6 in terms of $SiO_2$.

When the molar ratio (BTASA/AS) is beyond 7/3, hydrophobicity of the obtained coating film decreases, and it becomes difficult to obtain the coating film with a dielectric constant of 3.0 or below. When the molar ratio is below 3/7, an alkyl group derived from the alkoxysilane (AS) is increased in the obtained coating film, and it becomes insufficient to form a network of the —Si—O—Si—O— bond bridging at the part containing a lot of the alkyl group in the coating film and then the film strength tends to become low.

The coating liquid-A according to the present invention is prepared with a molar ratio (namely, TAAOH/(BTASA+AS)) of the tetraalkylammoniumhydroxide (TAAOH) to the sum of the bis(trialkoxysilyl)alkane (BTASA) and the alkoxysilane (AS) being preferably in the range from 1/10 to 6/10, more preferably in the range from 2/10 to 4/10 in terms of $SiO_2$ when the BTASA and AS are converted to $SiO_2$.

When the molar ratio (namely, TAAOH/(BTASA+AS)) is below 1/10, hydrolysis of the bis(trialkoxysilyl)alkane (BTASA) and the alkoxysilane (AS) is not sufficient, and it becomes difficult to keep the obtained coating liquid stably and then the life thereof may shorten. When the molar ratio is beyond 6/10, the tetraalkylammonium hydroxide (TAAOH) would be remained in the obtained coating film, and then adverse effects may occur to functions, for instance, of a semiconductor substrate which has the coating film thereon.

Next, a method of preparing a coating liquid for forming a low dielectric constant amorphous silica-based coating film according to the present invention is described below.

The low dielectric constant amorphous silica-based coating film (coating liquid A) according to the present invention is prepared as a liquid composition containing a silicon compound which is hydrolysate of the bis(trialkoxysilyl)alkane (BTASA) and the alkoxysilane (AS) by;

(i) mixing the bis(trialkoxysilyl)alkane (BTASA) and the alkoxysilane (AS) in an organic solvent, and agitating the mixture solution at the rotating speed of 100 to 200 rpm at a temperature of 10 to 30° C. until the components are fully mixed with each other;

(ii) then dripping an aqueous solution of tetraalkylammoniumhydroxide (TAAOH) over 5 to 20 minutes to the mixture solution being agitated, and further agitating the resultant mixture solution at a temperature of 10 to 30° C. for 30 to 90 minutes at the rotating speed of 100 to 200 rpm; and iii) then heating the mixture solution to a temperature of 40 to 80° C. preserving the mixture solution at the temperature and agitating the mixture solution for 1 to 72 hours at the rotating speed of 100 to 200 rpm.

In this process, in place of the method described above (in which the aqueous solution of TAAOH in step (ii) above is dripped in the mixture solution of the BTASA, AS and an organic solvent prepared in step (i) above), the mixture solution comprising bis(trialkoxysilyl)alkane (BTASA), the alkoxysilane (AS), and the organic solvent prepared in step (i) may be slowly dripped in the aqueous solution of tetraalkylammoniumhydroxide (TAAOH) prepared in step (ii) above over 30 to 90 minutes under the same conditions as those described above (namely, at the temperature of 10 to 30° C. and at the agitation speed of 100 to 200 rpm).

In this process, the bis(trialkoxysilyl)alkane (BTASA), the alkoxysilane (AS), and the tetraalkylammoniumhydroxide (TAAOH) are mixed at the molar ratio described above respectively.

The organic solvents which can be used in the present invention include, but not limited to, alcohols, ketones, ethers, esters, and hydrocarbons, and more specifically alcohols such as methanol, ethanol, propanol, and butanol; ketones such as methylethylketone, and methylisobutylketone; glycol ethers such as ethyleneglycolmonomethylether (methylcelosolb), ethyleneglycolmonoethylether (ethylcelosolb), propyleneglycolmonopropylether; glycols such as ethyleneglycol, propyleneglycol, and hexleneglycol; esters such as methylacetate, ethylacetate, methyllactate and ethyllactate; hydrocarbons such as hexane, cyclohexane, and octane;

and aromatic hydrocarbons such as toluene, xylene, and mesitylene. Of these, it is preferable to use the alcohols such as ethanol.

Although there is no specific restriction over a quantity of the organic solvent to be used, the mixing ratio by weight (namely, organic solvent/(BTASA+AS)) of the organic solvent to the sum of the bis(trialkoxysilyl)alkane (BTASA) and the alkoxysilane (AS) as components for forming the coating film is preferably in the range from 1/1 to 3/1, and more preferably in the range from 1/1 to 2.5/1.

Furthermore, the aqueous solution of tetraalkylammoniumhydroxide (TAAOH) dripped into the mixture organic solvent preferably contains the tetraalkylammoniumhydroxide (TAAOH) preferably by 5 to 40% by weight or more preferably by 10 to 30% by weight in distilled water or in ultrapure water. Because water contained in the aqueous solution is used for causing hydrolysis of the bis(trialkoxysilyl)alkane (BTASA) and the alkoxysilane (AS), the quantity must be enough to cause the hydrolysis reaction. Because the tetraalkylammoniumhydroxide (TAAOH) has the catalytic function for promoting the hydrolysis reaction, it is not necessary to add any other catalyst (such as ammonia) from the outside.

The hydrolysis reaction is preferably performed at a temperature in the range from 40 to 80° C., and more preferably in the range from 50 to 80° C. with agitation for 1 to 72 hours, and more preferably for 10 to 48 hours.

When the temperature is lower than 40° C., hydrolysis of the bis(trialkoxysilyl)alkane and the alkoxysilane (AS) does not occur smoothly, which makes it difficult to obtain a liquid composition containing sufficiently hydrolyzed components for forming a silica-based coating film within a practical period of time. When a coating film is formed with the liquid composition as described above, a coating film, in which the —Si—O—Si—O— bond bridging has sufficiently proceeded, is not formed, which makes it difficult to obtain a coating film having the sufficient strength. In addition, when alkoxysilane not having reacted remains in the liquid composition, the material not having reacted is evaporated and is blown out onto a surface of the coating film during a process of heating the coating film, which makes it difficult to form a coating film having a smooth surface. When the temperature is over 80° C., the organic solvent contained in the mixture solution actively evaporates, which makes it difficult to continue the hydrolysis reaction, and therefore it is difficult to obtain a liquid composition containing sufficiently hydrolyzed components for forming silica-based coating film. When the hydrolysis reaction is performed by putting the mixture solution in a pressurized and shielded vessel such as an autoclave and a temperature over 80° C. to prevent occurrence of the phenomenon described above, the components for forming a silica-based coating film may often be crystallized, which is not preferable.

When the reaction time is shorter than 1 hour, it is difficult to obtain a liquid composition containing the sufficiently hydrolyzed components for forming a silica-based coating film. On the other hand, the reaction time of over 72 hours is not practical, and sometimes the hydrolysis reaction (condensation reaction) exceeds excessively, which is disadvantageous.

A number average molecular weight of the silicon compounds (namely, hydrolysate of BTASA and AS) contained in the liquid composition obtained as described above is preferably in the range from 3,000 to 70,000 and more preferably in the range from 5,000 to 50,000 in terms of polyethyleneoxide. When the number average molecular weight is in the range, a coating liquid (namely the liquid composition) for forming a coating film shows an excellent and long-time stability and a high coating compatibility.

The liquid composition obtained as described above may be used as a coating liquid for forming a coating film as it is, but it is preferable to substitute, before its use, the organic solvent component contained in the liquid composition with an organic solvent selected from propyleneglycolmonopropylether (PGP), propyleneglycolmonomethylether (PGME), propyleneglycolmonoethyletheracetate (PGMEA) or the like by using, for instance, a rotary evaporator.

One of the specific examples (in which propyleneglycolmonopropylether (PGP) is used as the organic solvent for solvent substitution) is as described below. With the operation, it is possible to obtain a liquid composition containing the silicon compound in which the organic solvent used in the previous step is substituted with a new organic solvent.

(i) The liquid composition obtained as described above is put in a flask of a rotary evaporator, and furthermore propyleneglycolmonopropylether (PGP) or a mixture solution of propyleneglycolmonopropylether (PGP) and water is put in the flask.

(ii) Then, the rotary evaporator is driven and rotated at a temperature in the range from 50 to 90° C., and more preferably in the range from 60 to 80° C. in the depressurized state in the range from −0.05 to −0.1 MPa, and more preferably in the range from −0.08 to −0.1 MPa at the rotating speed of 30 to 120 rpm, and more preferably of 60 to 90 rpm. With the operation, the organic solvent (such as ethanol) and water are evaporated, so that the evaporated materials are cooled and discharged to the outside.

(iii) By carrying out the operation (ii) described above for a required period of time, it is possible to obtain a liquid composition in which the organic solvent has been substituted with the propyleneglycolmonopropylether (PGP).

In the step (i) above, it is also possible to carry out the solvent substitution by put only the liquid compositions obtained as described above in a flask of a rotary evaporator, performing the operation (ii) above to discharge the evaporated organic solvent and water to the outside, and then adding the propyleneglycolmonopropylether (PGP) or a mixture solution of water and propyleneglycolmonopropylether (PGP). In this case, however, the silicon compound contained in the liquid composition may disadvantageously be denatured.

When the solvent substitution is carried out, the organic solvent or water contained in the liquid composition, and furthermore alcohols generated as byproducts in association with hydrolysis of alkoxysilane (AS) or the like are separated and removed. When the operation is performed with a rotary evaporator, the solvent substitution can be performed almost perfectly, but in the present invention, the perfect solvent substitution is not always required.

An amount of the silicon compound to be contained in the liquid composition obtained as described above varies according to the purpose of its usage, and generally it is preferable to adjust the amount to the range from 1 to 20% by weight, more preferably to the range from 1 to 10% by weight against the total weight of the liquid composition in terms of $SiO_2$ when the silicon compound is converted $SiO_2$. When the content is over 20% by weight, stability of the coating liquid is deteriorated when used for a long time, and when the content is less than 1% by weight, it is difficult to form a uniform coating film on a substrate.

There is no specific restriction over a quantity of water contained in the liquid composition, but the quantity is preferably 60% by weight or below, and more preferably in the range from 0.1 to 50% by weight against the total weight of the liquid composition. When the water content is over 60% by weight, a surface tension of the liquid composition (namely, coating liquid) becomes higher, and the coating liquid is repelled on an applied surface of a semiconductor substrate or the like, which makes it difficult to form a uniform coating film on the entire applied surface. Namely, such parameters as the coating compatibility or a thickness of a coating film vary according to the water contents, and therefore it is preferable to prepare the liquid composition by taking into considerations the conditions for forming a desired silica-based coating film.

Furthermore, there is no specific restriction over a content of the organic solvent because the organic solvent is a balance component constituting the liquid composition, but it is preferable that the organic solvent is contained in the liquid composition by the content of 22 to 99% by weight. It is to be noted that the organic solvent content as used herein means a total weight of the organic solvent used in the solvent substitution step (such as propyleneglycolmonopropylether) and the organic solvent (such as ethanol) not having been substituted and still remaining therein.

With the operation as described above, it is possible to obtain a coating liquid-A for forming a low dielectric constant amorphous silica-based coating film having smoothness of its surface, a high film strength and an excellent hydrophobicity.

2. [Coating Liquid-B]

The second coating liquid according to the present invention (namely, coating film-B) is a coating liquid for forming a low dielectric constant amorphous silica-based coating film having smoothness of its surface, a high film strength and an excellent hydrophobicity, which comprises;

a silicon compound obtained by hydrolyzing bis(trialkoxysilyl)alkane (BTASA) expressed by the following general formula (I), alkoxysilane (AS) expressed by the following general formula (II), and tetraalkyl orthosilicate (TAOS) in the presence of tetraalkylammoniumhydroxide (TAAOH) at a temperature in the range of 40 to 80° C.:

(I)

(wherein $R^1$ denotes a methylene group, an ethylene group, or a propylene group; and $R^2$ to $R^7$, which may be identical or different, denotes a hydrogen atom, an alkyl group having 1 to 8 carbon atoms, a fluorine-substituted alkyl group, an allyl group, or a vinyl group), (II)

(wherein $R^8$ denotes a hydrogen atom, a fluorine atom, an alkyl group having 1 to 8 carbon atoms, a fluorine-substituted alkyl group, an allyl group, or a vinyl group; and $R^9$ denotes a hydrogen atom, an alkyl group having 1 to 8 carbon atoms, an allyl group, or a vinyl group, and n is an integer from 0 to 3.)

The bis(trialkoxysilyl)alkane (BTASA), the alkoxysilane (AS), and the tetraalkylammoniumhydroxide (TAAOH) may be the same as those used for preparation of the coating liquid-A.

The tetraalkyl orthosilicate (TAOS) as described above includes, but not limited to, tetramethylorthosilicate, tetraethylorthosilicate, tetrapropylorthosilicate, tetraisopropylorthosilicate and tetrabutylorthosilicate. Of these, it is preferable to use tetraethylorthosilicate (TEOS), tetramethylorthosilicate (TMOS) or a mixture thereof.

When the tetraalkylammoniumhydroxide (TAAOH) procured from the market is used, it is necessary to subject the material to the treatments in two stages using a cation-exchange resin and also an anion-exchange resin respectively for the purpose to substantially remove impurities comprising compounds of alkali metal elements such as sodium (Na) and potassium (K) and halogen group elements such as bromine (Br) and chlorine (Cl), like in the case of the coating liquid-A. Namely, it is necessary to reduce contents of the impurities comprising compounds of alkali metal elements such as sodium (Na) and potassium (K) contained therein to 50 ppb by weight or below on the respective element bases, and also reduce contents of the impurities comprising compounds of halogen group elements such as bromine (Br) and chlorine (Cl) to 1 ppm by weight or below on the respective element bases.

Like in the case of the coating liquid-A, the coating liquid-B according to the present invention is prepared with a molar ratio (namely, BTASA/AS) of the bis(trialkoxysilyl)alkane (BTASA) to the alkoxysilane (AS) being preferably in the range from 7/3 to 3/7, and more preferably in the range from 6/4 to 4/6 in terms of $SiO_2$.

Furthermore, the coating liquid-B is prepared with a molar ratio (namely, (BTASA+AS)/TOS) of the sum of the bis(trialkoxysilyl)alkane (BTASA) and the alkoxysilane (AS) to the tetraalkylorthosilicate (TAOS) being preferably in the range from 99/1 to 50/50, and more preferably in the range from 99/1 to 70/30, and still more preferably in the range from 90/10 to 70/30 in terms of $SiO_2$.

The tetraalkylorthosilicate (TAOS) is one of the useful materials for forming a low dielectric constant amorphous silica-based coating film having a high film strength, but when used together with the bis(trialkoxysilyl)alkane (BTASA), the dielectric constant of the obtained coating film is apt to become higher. In other words, as compared to the case where the coating liquid-A is used, the film strength of the obtained coating film becomes higher, but the dielectric constant of the film will be increased. Therefore, for obtaining a coating film having a low dielectric constant of 3.0 or below, it is preferable to mix the tetraalkylorthosilicate (TAOS) so that the molar ratio of (BTASA+AS)/TAOS is less than 50/50. On the other hand, when the molar ratio of (BTASA+AS)/TAOS is over 99/1, the effect obtained by adding the tetraalkylorthosilicate (TAOS) can be expected little.

Furthermore, the coating liquid-B is desirably prepared with a molar ratio-(namely, TAAOH/(BTASA+AS+TAOS)) of the tetraalkylammoniumhydroxide (TAAOH) to the sum of the bis(trialkoxysilyl)alkane (BTASA), the alkoxysilane (AS) and the tetraalkylorthosilicate (TAOS) being preferably in the range from 1/10 to 6/10, and more preferably in the range from 2/10 to 4/10 in terms of $SiO_2$ when the BTASA, AS and TAOS are converted to $SiO_2$.

A method of preparing the coating liquid for forming a low dielectric constant amorphous silica-based coating film (namely, coating liquid-B) according to the present invention is as described below.

The coating liquid for forming a low dielectric constant amorphous silica-based coating film according to the present invention (namely, coating liquid-B) is prepared as a liquid composition containing a silicon compound which is hydrolysate of the bis(trialkoxysilyl)alkane (BTASA), the alkoxysilane (AS) and the tetraalkyl orthosilicate (TAOS) by; (i) mixing the bis(trialkoxysilyl)alkane (BTASA), the alkoxysilane (AS) and the tetraalkylorthosilicate (TAOS) in an organic solvent, and agitating the mixture solution at the rotating speed of 100 to 200 rpm at a temperature of 10 to 30° C. until the components are fully mixed with each other;

(ii) then dripping an aqueous solution of tetraalkylammoniumhydroxide (TAAOH) over 5 to 20 minutes to the mixture solution being agitated, and further agitating the resultant mixture solution at a temperature of 10 to 30° C. for 30 to 90 minutes at the rotating speed of 100 to 200 rpm; and (iii) then heating the mixture solution to a temperature of 40 to 80° C., preserving the mixture solution at the temperature and agitating the mixture solution for 1 to 72 hours at the rotating speed of 100 to 200 rpm.

In this process, in place of the method as described above (in which the aqueous solution of TAAOH in step (ii) above is dripped in a mixture solution of the BTASA, AS, TAOS and an organic solvent prepared in step (i) above), the mixture solution comprising bis(trialkoxysilyl)alkane (BTASA), the alkoxysilane (AS), the tetraalkylorthosilicate (TAOS) and an organic solvent prepared in step (i) may be slowly dripped in the aqueous solution of tetraalkylammoniumhydroxide (TAAOH) prepared in step (ii) above over 30 to 90 minutes under the same conditions as those described above (namely, at a temperature of 10 to 30° C. and at an agitation speed of 100 to 200 rpm).

In this process, the bis(trialkoxysilyl)alkane (BTASA), the alkoxysilane (AS), the tetraalkylorthosilicate (TAOS) and the tetraalkylammoniumhydroxide (TAAOH) are mixed or added respectively so that the molar ratio described above is achieved.

The same organic solvent as that employed for preparing the coating liquid-A may be used in this process. In this process, the organic solvents mixed in the bis(trialkoxysilyl)alkane (BTASA), the alkoxysilane (AS) and the tetraalkylorthosilicate (TAOS) respectively may be different so long as the type (such as alcohols) is identical, but it is preferable to use the same organic solvent, if possible.

Although there is no specific restriction over the amount of the organic solvent to be used, the mixing ratio by weight (namely, organic solvent/(BTASA+AS+TAOS)) of the organic solvent to the sum of the bis(trialkoxysilyl)alkane (BTASA), the alkoxysilane (AS), and the tetraalkylorthosilicate (TAOS) as components for forming the coating film is preferably in the range from 1/1 to 3/1, and more preferably in the range from 1/1 to 2.5/1, like in the case of the coating liquid-A Furthermore, the aqueous solution of the tetraalkylammoniumhydroxide (TAAOH) dripped into the mixed organic solvent preferably contains the tetraalkylammoniumhydroxide (TAAOH) preferably by 5 to 40% by weight, and more preferably by 10 to 30% by weight in distilled water or in ultrapure water, like in the case of the coating liquid-A.

The hydrolysis reaction is preferably performed at a temperature in the range from 40 to 80° C. and more preferably in the range from 50 to 80° C. with agitation for 1 to 72 hours, and more preferably for 10 to 48 hours, like in the case of the coating liquid-A.

A number average molecular weight of the silicon compound (namely, hydrolysate of BTASA, AS and TAOS) contained in the liquid composition obtained as described above is preferably in the range from 3,000 to 70,000 or more preferably in the range from 5,000 to 50,000 in terms of polyethyleneoxide, like in the case of the coating liquid-A.

In the coating liquid-B according to the present invention, like in the case of the coating liquid-A, the liquid composition containing the components for forming a silica-based coating film obtained by the method described above may be used as a coating liquid for forming a coating film as it is, but it is preferable to use the liquid composition after subjecting the organic solvent components contained in the liquid composition to solvent substitution with an organic solvent selected from propyleneglycolmonopropylether (PGP), propyleneglycolmonomethylether (PGME), propyleneglycolmonoethyletheracetate (PGMEA) or the like by using a rotary evaporator or the like.

An amount of the silicon compound to be contained in the liquid composition obtained as described above varies according to the purpose of its usage, but is preferably in the range from 1 to 20% by weight, and more preferably in the range from 1 to 10% by weight against the total weight of the liquid composition in terms of $SiO_2$ when the silicon compound is converted $SiO_2$.

There is no specific restriction over a quantity of water contained in the liquid composition, but the quantity is preferably 60% by weight, and more preferably in the range from 0.1 to 50% by weight against the total weight of the liquid composition, like in the case of the coating liquid-A.

Furthermore, there is no specific restriction over a content of the organic solvent, because the organic solvent is a balance component constituting the liquid composition, but it is preferable that the content is in the range from 20 to 99% by weight against the total weight of the liquid composition, like in the case of the coating liquid-A.

When the requirements as described above are satisfied, it is possible to obtain the coating liquid-B for forming a low dielectric constant amorphous silica-based coating film having smoothness of its surface, a high film strength and an excellent hydrophobicity.

[Method of Forming a Low Dielectric Constant Amorphous Silica-Based Coating Film]

Typical methods for forming a low dielectric constant amorphous silica-based coating film by using the coating liquid according to the present invention are as follows;

(1) a method in which the coating liquid for forming a low dielectric constant amorphous silica-based coating film is applied on a substrate, then heating the substrate at a temperature in the range from 80 to 350° C., and furthermore curing the substrate at a further higher temperature in the range from 340 to 450° C. ("Coating film forming method-A" as described below), and (2) a method in which the coating liquid for forming a low dielectric constant amorphous silica-based coating film is applied on a substrate, substrate is heated at a temperature in the range from 80 to 350° C., and furthermore the substrate is cured by irradiating electron beam, ultraviolet ray, or microwave ("Coating film forming method-B"" as described below).

The details of the coating film forming methods hereinabove are described below.

3. [Coating Film Forming Method-A]

Applying Step

Generally, any of the spin coating method, the dip coating method, the roll coating method, the transcribing method or the like is employed for applying a coating liquid for forming a coating film on a substrate, and also in the present invention, the coating liquid for forming a low dielectric constant amorphous silica-based coating film can be applied by any of the known methods as described above. Of these methods, the spin coating method is generally used when the coating liquid is applied on a semiconductor substrate, because the method can provide a coating film with a uniform thickness and generates a film containing no dusts substantially. Therefore, in the present invention, it is preferable to employ the spin coating method as the applying method, but, for instance, the transcribing method may be employed when the coating liquid is applied on a semiconductor substrate with a large diameter.

It is to be noted that the expression of "applying a coating liquid on a substrate" includes not only directly applying the coating liquid on the substrate, but also applying the coating liquid on a protective film such as an etching stopper film and a CMP sacrifice film, or other films formed on the substrate.
Heating Step The coating film applied on a substrate as described above is heated at a temperature in the range from 80 to 350° C.

When the heating step is performed at a temperature over 350° C., the organic solvent contained in the applied coating film rapidly evaporates, which may sometimes lead to generation of pores or voids each having a large diameter and as a result to lowering of the film strength. Therefore, it is desirable to perform gradually making increase in the temperature step by step in the range from 80 to 350° C. For instance, the applied coating film should preferably be heated at 150° C. for 1 minute, at 250° C. for 1 minute, and furthermore at 350° C. for 1 minute. When the heating step is performed at a temperature of less than 80° C., the organic solvent contained in the applied coating film evaporates little and remains in the coating film as it is, and in this case not only the purpose of this heating step can not be achieved, but also non-uniformity may be generated in a thickness of a formed coating film.

A period of time required for heating varies according to such a parameter as a thickness of the film or the like, but generally the time is in the range from 1 to 10 minutes, and more preferably in the range from 2 to 5 minutes.

The heating step may be performed in the nitrogen atmosphere as an inert gas or in the atmospheric air. This process is performed for a short period of time at a relatively low temperature of 350° C. or below, and therefore even if the process is performed in the atmospheric air containing a relatively large amount of oxygen, damages such as oxidation of metal wiring provided on a semiconductor substrate seldom occur. If it is performed in the atmospheric air, there is a possibility that an extremely small amount of oxygen is taken into the coating film, and then a silica-based coating film, in which the —Si—O—Si—O— bond bridging has substantially proceeded, is produced during the curing process as described later, which makes it possible to form a low dielectric constant amorphous silica-based coating film having a high strength and an excellent hydrophobicity.

When the heating step is performed under the conditions as described above, the organic solvent contained in the applied coating film evaporates and also the tetraalkylammoniumhydroxide (TAAOH) contained therein is decomposed and/or vaporized, and thus generated gaseous components go out from such a coating film. Whilst, during the heating step, polymerization and curing of components for forming a silica-based coating film promote in the applied coating film, and as the molten viscosity of thus polymerized components becomes lower, the reflowing property of such polymerized components increases, which results in obtaining a coating film having smoothness of its surface as described above.

It is to be noted that the heating step is preferably performed in the state in which the substrate obtained in the applying process as described above is placed on a sheet-fed hot plate.
Curing Step Then, the coating film having been subjected to the heating step as described above is cured in the atmosphere of inert gas at a temperature in the range from 340 to 450° C., which is higher than the temperature employed in the heating step.

It is preferable to use nitrogen gas as the inert gas, and it is allowable, if required, to use an inert gas containing a small amount of oxygen gas (for instance, oxygen by about 500 to about 10,000 ppm by volume) or air (Refer to, for instance, WO 01/48806 A1).

A temperature for the curing step varies according to a type and a quantity of tetraalkylammoniumhydroxide (TAAOH) used for preparation of the coating liquid for forming a coating film as described above as well as to characteristics of the silicon compounds contained in the coating liquid (namely, components for forming a silica-based coating film), and generally it is preferable to select a temperature in the range from 340 to 450° C. for obtaining a low dielectric constant amorphous silica-based coating film having a high strength and an excellent hydrophobicity.

When the temperature selected in the curing step is less than 340° C., the —Si—O—Si—O— bond bridging between components for forming a silica-based coating film hardly proceeds, so that a coating film having a sufficient film strength can not be obtained. When the temperature for the curing step is over 450° C., such materials as aluminum wiring or copper wiring constituting a semiconductor substrate may be oxidized or melted, which may give fatal damages to the wiring layer.

A time required for the curing step varies according to such parameters as a type of a coating liquid for forming a coating film and a thickness of a coating film to be prepared, but generally the time is in the range from 5 to 90 minutes, and more preferably in the range from 10 to 60 minutes.

Furthermore, in this curing step, the substrate is preferably placed on a sheet-fed hot plate like in the heating step.

A thickness of the silica-based coating film obtained as described above varies according to a semiconductor substrate on which the coating film is to be formed or dependent upon the purpose of its usage, and generally is in the range from 100 to 600 nm on a silicon substrate (namely, silicon wafer) in a semiconductor device, and in the range from 100 to 1000 nm at a place between wiring layers in a multilayered structure.

4. [Coating Film Forming Method B]
Applying Step

In the coating film forming method-B, the coating liquid according to the present invention is applied on a substrate, like in the case of coating film forming method-A as described above.
Heating Step The coating film applied on a substrate is heated at a temperature preferably in the range from 80 to 350° C., like in the case of coating film forming method-A.
Curing Step The coating film having been subjected to the heating step can be cured by irradiating electron beam, ultraviolet ray, or microwave thereto. A method of curing the coating film by irradiating electron beam in an inert gas atmosphere is described as an example of the curing method, but it is needless to say that any of the known methods such as irradiation of ultraviolet ray or microwave may be employed.

A voltage for acceleration of the irradiated electron beam is preferably in the range from 10 to 26 kV. When the voltage for acceleration is over 26 kV, a silicon substrate (namely, silicon wafer) or a silica-based coating film formed thereon is substantially damaged, and sometimes a specific dielectric constant of the coating film may become higher than a desired value (namely, 3.0 or below). When the voltage for acceleration is less than 10 kV, sometimes a silica-based coating film having the desired strength will not be obtained.

An exposure dose of the electron beam is preferably in the range from 50 to 1000 μC/cm², and more preferably in the range from 300 to 600 μC/cm². When the exposure dose is over 1000 μC/cm², sometimes a specific dielectric constant of the formed silica-based coating film is higher than the desired value (namely, 3.0 or below). When the exposure dose is less than 50 μC/cm², sometimes a silica-based coating film having the desired strength will not be obtained.

Furthermore, it is preferable to carry out the irradiation of the electron beam in an inert gas atmosphere such as nitrogen gas heated to a temperature in the range from 280 to 410° C., and more preferably in the range from 300 to 400° C. When the temperature is over 410° C., aluminum wiring or copper wiring constituting a semiconductor substrate is oxidized or melted, which may give fatal damages to the wiring layer. When the temperature is less than 280° C., the —Si—O—Si—O— bond bridging hardly proceeds in precursors of the components for forming a silica-based coating film, which may make it impossible to obtain a coating film having the sufficient strength.

A period of time required for the curing step varies according to a type of a coating liquid for forming a coating film or a thickness of the coating film, but the time is generally in the range from 5 to 90 minutes, and preferably in the range from 10 to 60 minutes. In the curing step, a substrate is preferably placed on a sheet-fed hot plate, like in the heating step.

A thickness of the silica-based coating film varies according to a substrate on which the coating film is to be formed or dependent upon the purpose of its usage, and a thickness of the coating film on a silicon substrate (namely, silicon wafer) in a semiconductor device is generally in the range from 100 to 600 nm, and at a place between wiring layers in a multilayered structure, the thickness is generally in the range from 100 to 1000 nm.

5. [Low Dielectric Constant Amorphous Silica-Based Coating Film]

A silica-based coating film formed by using the coating liquid according to the present invention has a low dielectric constant of 3.0 or below, and more specifically of 2.5 or below, and also a high strength expressed by Young's modulus of 3.0 GPa or more.

With the coating liquid according to the present invention, it is possible to easily form a silica-based coating film having a smooth surface with the surface roughness (Rms) of 1.0 nm or below. The surface roughness is defined as a root mean square roughness of values measured with an atomic force microscope (AMF). Because of the feature, the complicated process for flattening a surface of the coating film formed on a substrate is not always required, and there is not any defect as observed on a zeolitic coating film as described above. In addition, the silica-based coating film itself has an excellent hydrophobicity, and therefore, even if the coating film is left in the atmospheric air containing saturated water vapor, the specific dielectric constant is not deteriorated (namely, the dielectric constant does not increase).

The silica-based coating film is highly adhesive to a surface of a semiconductor substrate on which the coating film is to be formed and excellent in a chemical resistance such as resistance against alkali and resistance against cracking, and is also excellent in resistance against an oxygen plasma as well as in workability by etching or other mechanical processing.

The silica-based coating film is an amorphous one not having the X-ray diffraction peaks showing the MFI crystalline structure, the peaks of which are generally measured in a zeolitic coating film.

APPLICABILITY FOR INDUSTRIAL PURPOSES

The coating liquid according to the present invention is used for forming a silica-based coating film at such places as on a semiconductor substrate, between wiring layers in a multilayered structure, on a surface of an elemental device and/or a substrate on which an PN junction is provided, or on a substrate on which a multilayered structure is provided. Of these applications, the coating liquid according to the present invention is suited to use for forming an interlayer insulating film on a semiconductor substrate.

The present invention is described in detail with reference to examples thereof, but the present invention is not limited to the examples.

Example 1

300 g of cation-exchange resin powder (WK-40, Mitsubishi Chemical Corporation) was added to 1 Kg of an aqueous solution containing tetrapropylammoniumhydroxide (TPAOH, Lion Corporation) by 40% by weight, and the mixture solution was agitated at the room temperature for one hour at the rotating speed of 100 rpm, and then the added cation-exchange resin powder was removed by filtering. Then, 2100 g of anion-exchange resin powder (SAT-10, Mitsubishi Chemical Corporation) was added to the mixture solution, and the resultant mixture solution was agitated at the room temperature for one hour at the rotating speed of 100 rpm, and then the added anion-exchange resin powder was removed by filtering.

Ultra pure water was added to the aqueous solution containing tetrapropylammoniumhydroxide (TPAOH) obtained as described above to adjust the concentration to 10% by weight, and then amounts of compounds of alkali metal elements such as sodium (Na) and potassium (K) and compounds of halogen group elements such as bromine (Br) and chlorine (Cl) contained in the aqueous solution as impurities were measured by the atomic absorption method (AAS method with an atomic absorption photometer Z-5710 produced by Hitachi, Ltd) and by the ion chromatography method (2020i produced by DIONEX).

Furthermore, ultra pure water was added to an aqueous solution of the tetrapropylammoniumhydroxide (TPAOH) not having been subjected to the ion exchange treatments (namely, TPAOH having a property of product purchased from the market) to adjust the concentration to 10% by weight, and then contents of impurities were measured as described above.

Amounts of impurities contained in the aqueous solution before being subjected to the ion exchange treatments were 50 ppm by weight for sodium, 2500 ppm by weight for potassium, 2250 ppm by weight for bromine, and 13 ppm by weight on the respective element bases, but the contents of the impurities contained in the aqueous solution having been subjected to the ion exchange treatments were 10 ppb by weight for sodium (a limit for detection), 10 ppb by weight for potassium (a limit for detection), 1 ppm by weight for bromine, and 1 ppm by weight for chlorine on the respective element bases.

Namely, the aqueous solution of tetrapropylammoniumhydroxide (TPAOH), which was purchased from the market, was highly purified to an allowable level of impurities in the present invention.

Then, bis(triethoxysilyl)methane (BTESM, produced by GELEST), methyltrimethoxysilane (MTMS, produced by Shin-Etsu Chemical Co., Ltd), and ethanol with the concentration of 99.5% by weight (ETOH, produced by Wako Pure Chemical Industries Co., Ltd.) were mixed at the percentages as shown in Table 1, and the mixture solution was preserved at the temperature of 20° C. and agitated for 30 minutes at the rotating speed of 150 rpm.

The aqueous solution of highly purified tetrapropylammoniumhydroxide (containing TPAOH by 10% by weight) was dripped in the mixture solution at the percentage as shown in Table 1 over 10 minutes, and the resultant mixture solution was agitated for one hour at 20° C. at the rotating speed of 200 rpm. Then, the mixture solution was heated to the temperatures as shown in Table 1 and agitated for 20 hours at the temperatures and at the rotating speed of 200 rpm to hydrolyze the components for forming a silica-based coating film (namely, BTESM and MTMS).

Then, ethanol (namely, organic solvent) in the mixture solution containing hydrolysate of the components for forming a silica-based coating film was subjected to solvent substitution with propyleneglycolmonopropylether (PGP, produced by Nippon Nyukazai Co., Ltd.) by using a rotary evaporator (R-114 produced by Shibata Scientific Technology Ltd.), and then the concentration of the silicon compound comprising the hydrolysate of bis(triethoxysilyl)methane (BTESM) and methyltrimethoxysilane (TMMS) was adjusted to obtain the liquid composition containing the silicon compound by 6% by weight in terms of $SiO_2$ (namely, Example coating liquid (1)-1 to (1)-2).

Furthermore, ethanol in the mixture solution used for preparation of Example coating liquid (1) above was subjected to solvent substitution with propyleneglycolmonomethylether (PGME produced by Nippon Nyukazai CO., Ltd.) by using a rotary evaporator (R-114 produced by Shibata Scientific Technology Ltd.), and a concentration of the silicon compound comprising the hydrolysate of bis(triethoxysilane) methane (MTESM) and methyltrimethoxysilane (MTMS) was adjusted to obtain the liquid composition containing the silicon compound by 6% by weight in terms of $SiO_2$ (namely, Example coating liquid (1)-3).

Of the coating liquids as described above, Example coating liquid (1)-1 was selected, and a number average molecular weight of the silicon compound contained in the liquid composition was measured by a liquid chromatography method, and found out that the number average molecular weight was about 10000 in terms of polyethyleneoxide.

5 ml of the coating liquid for forming a coating film obtained as described above was dripped for 20 seconds at the rotating speed of 2000 rpm on a silicon wafer substrate (namely, semiconductor substrate) having the size of 8 inches in diameter by the known spin coating method (ACT-8 produced by Tokyo Electron Corp.) to apply the coating liquid on the substrate.

Then the substrate was placed on a sheet-fed hot plate and heated for 3 minutes at the temperature of 150° C. in the nitrogen atmosphere. The organic solvent (PGP) and other components contained in the coating film were evaporated or vaporized during the heating step, and then the evaporated or vaporized components were discharged to the outside.

Furthermore, in the state where the above substrate was placed on the sheet-fed hot plate, each of the substrate was cured for 30 minutes at the temperature of 300° C. in the nitrogen atmosphere. Thereafter, the thus obtained substrates (namely, Example substrate (1)-1 to (1)-3) were cooled to a temperature close to the room temperature and were taken out to the outside.

The thickness of each silica-based coating film formed on the Example substrates (1)-1 to (1)-3 was about 500 nm (when measured with a spectroscopic ellipsometer ESVG produced by SOPRA Corp.).

Figure 1:
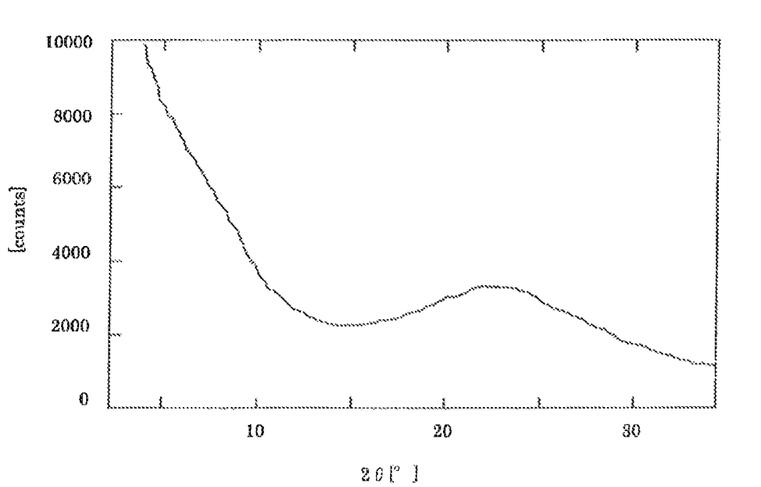
FIG. 1 shows a result of X-ray diffraction of a silica-based coating film (namely, an amorphous coating film) formed on the Example substrate (1)-3. In the zeolitic coating film with the silicon compound having the MFI crystal structure, the X-ray diffraction peaks appear at 2θ of 8°, 9° and 23°, but the peaks do not appear in the coating film of the Example substrate (1)-3.

Then, measurements were performed for the following parameters of each silica-based coating film formed on the Example substrates (1)-1 to (1)-3: (i) a specific dielectric constant (by the mercury probe method with SSM 495 produced by Solid State Measurements Corp. at the frequency of 1 MHz); (ii) changes in the water-vapor adsorption rate of the coating film before and after irradiation of oxygen plasma (by the Thermal Desorption Mass-Spectroscopy (TDS) method with EMD-1000 produced by Electronic Science Corp.), (iii) a film strength (Young's modulus by Nano Indentation Method with Nano-Indenter XP produced by MTS Systems Corp.), (iv) a surface roughness (Rms, AFM method), and (v) X-ray diffraction peaks (for determination as to whether the coating film is amorphous or crystalline: X-ray diffraction method). The results of the measurement are shown in Table 2. Further, the result of the X-ray diffraction of the coating film formed on the Example substrate (1)-3 is shown in FIG. 1.

Example 2

Bis(triethoxysilyl)methane (BTESE, produced by GELEST), methyltrimethoxysilane (MTMS, produced by Shin-Etsu Chemical Co., Ltd), and ethanol with the concentration of 99.5% by weight (ETOH, produced by Wako Pure Chemical Industries Co., Ltd.) were mixed at the percentages as shown in Table 1, and the mixture solution was preserved at the temperature of 20° C. and agitated for 30 minutes at the rotating speed of 150 rpm.

The aqueous solution of highly purified tetrapropylammoniumhydroxide (containing TPAOH by 10% by weight) was dripped in the mixture solution at the percentage as shown in Table 1 over 10 minutes, and the resultant mixture solution was agitated for one hour at the temperature of 20° C. and at the rotating speed of 200 rpm. Then, the mixture solution was heated to the temperatures as shown in Table 1 and agitated for 20 hours at the temperatures and at the rotating speed of 200 rpm to hydrolyze the components for forming a silica-based coating film (namely, BTESE and MTMS).

Then, ethanol (namely, organic solvent) in the mixture solution containing hydrolysate of the components for forming a silica-based coating film was subjected to solvent substitution with propyleneglycolmonopropylether (PGP, produced by Nippon Nyukazai Co., Ltd.) by using a rotary evaporator (R-114 produced by Shibata Scientific Technology Ltd.), and then the concentration of the silicon compound comprising hydrolysate of bis(triethoxysilyl)methane (BTESM) and methyltrimethoxysilane (TMMS) was adjusted to obtain the liquid composition containing the silicon compound by 6% by weight in terms of $SiO_2$ (namely, Example coating liquid (2)-1 to (2)-3).

Of the coating liquids, Example coating liquid (2)-3 was selected, and a number average molecular weight of the silicon compound contained in the liquid composition was measured by a liquid chromatography method, and found that the number average molecular weight was about 21,000 in terms of polyethyleneoxide.

5 ml of the coating liquid for forming a coating film was applied on a silicon wafer substrate (namely, semiconductor substrate) having the size of 8 inches in diameter by the spin coating method under the same conditions as those employed in Example 1.

Then, the substrate was heated and cured under the same conditions as those in Example 1. Furthermore, the thus obtained substrates (namely, Example substrates (2)-1 to (2)-3) were cooled to a temperature close to the room temperature, and then were taken out to outside.

The thickness of each silica-based coating film formed on the Example substrates (2)-1 to (2)-3 was about 500 nm.

Then, a specific dielectric constant, changes in the water-vapor adsorption rate before and after irradiation of oxygen plasma, a film strength, a surface roughness, and X-ray diffraction peaks of each silica-based coating film formed on the Example substrates (2)-1 to (2)-3 were measured by the methods as described in Example 1. The results of the measurement are shown in Table 2.

Example 3

Bis(triethoxysilyl)ethane (BTESE, produced by GELEST), methyltriethoxysilane (MTES, produced by Shin-Etsu Chemical Co., Ltd), and ethanol with the concentration of 99.5% by weight (ETOH, produced by Wako Pure Chemical Industries Co., Ltd.) were mixed at the percentages as shown in Table 1, and the mixture solution was preserved at the temperature of 20° C. and agitated for 30 minutes at the rotating speed of 150 rpm.

The aqueous solution of highly purified tetrapropylammoniumhydroxide (containing TPAOH by 10% by weight) was dripped in the mixture solution at the percentages as shown in Table 1 over 10 minutes, and the resultant mixture solution was agitated for one hour at the temperature of 20° C. and at the rotating speed of 200 rpm. Then, the mixture solution was heated to the temperatures as shown in Table 1 and agitated for 20 hours at the temperatures and at the rotating speed of 200 rpm to hydrolyze the components for forming a silica-based coating film (namely, BTESE and MTES).

Then, ethanol (namely, organic solvent) in the mixture solution containing hydrolysate of the components for forming a silica-based coating film was subjected to solvent substitution with propyleneglycolmonomethylether (PGME, produced by Nippon Nyukazai Co., Ltd.) by using a rotary evaporator (R-114 produced by Shibata Scientific Technology Ltd.), and then the concentration of the silicon compound comprising hydrolysate of bis(triethoxysilyl)ethane (BTESE) and methyltriethoxysilane (MTES) was adjusted to obtain the liquid composition containing the silicon compound by 6% by weight in terms of $SiO_2$ (namely, Example coating liquids (3)-1 to (3)-2).

5 ml of the coating liquid for forming a coating film obtained as described above was applied to a silicon wafer substrate (namely, semiconductor substrate) having the size of 8 inches in diameter by the spin coating method under the same conditions as those employed in Example 1.

Then, under the same conditions as those in Example 1, these substrates were heated and cured. Furthermore, the thus obtained substrates (namely, Example substrate (3)-1 to (3)-2) were cooled to a temperature close to the room temperature, and then were taken out to the outside.

The thickness of each silica-based coating film formed on the Example substrates (3)-1 to (3)-2) was about 500 nm.

Then, a specific dielectric constant, changes in the water-vapor adsorption rate before and after irradiation of oxygen plasma, a film strength, a surface roughness, and X-ray diffraction peaks of each silica-based coating film formed on the Example substrates (3)-1 to (3)-2) were measured by the methods as described in Example 1. The results of the measurement are shown in Table 2.

Example 4

300 Kg of cation-exchange resin powder (WK-40, Mitsubishi Chemical Corporation) was added to 1 Kg of an aqueous solution containing tetrabutylammoniumhydroxide (TBAOH, Lion Corporation) by 40% by weight, and the mixture solution was agitated at the room temperature for one hour at the rotating speed of 100 rpm, and then the added cation-exchange resin powder was removed by filtering. Then 2100 g of anion-exchange resin powder (SAT-10, Mitsubishi Chemical Corporation) was added to the mixture solution, and the resultant mixture solution was agitated at the room temperature for one hour at the rotating speed of 100 rpm, and then the added anion-exchange resin powder was removed by filtering.

Ultra pure water was added to the aqueous solution containing tetrabutylammoniumhydroxide (TBAOH) obtained as described above to adjust the concentration to 10% by weight, and then amounts of compounds of alkali metal elements such as sodium (Na) and potassium (K) and compounds of halogen group elements such as bromine (Br) and chlorine (Cl) contained in the aqueous solution as impurities were measured by the atomic absorption method (AAS method with an atomic absorption photometer Z-5710 produced by Hitachi, Ltd) and by the ion chromatography method (2020i produced by DIONEX).

Furthermore, ultra pure water was added to an aqueous solution of the tetrabutylammoniumhydroxide (TBAOH) not having been subjected to the ion exchange treatments (namely, TBAOH having a property of product purchased from the market) to adjust the concentration to 10% by weight, and then contents of impurities were measured as described above.

Amounts of impurities contained in the aqueous solution before being subjected to the ion exchange treatments were 50 ppm by weight for sodium, 1000 ppm by weight for potassium, 900 ppm by weight for bromine, and 30 ppm by weight on the respective element bases, but the contents of the impurities contained in the aqueous solution having been subjected to the ion exchange treatments were 10 ppb by weight for sodium (a limit for detection), 10 ppb by weight for potassium (a limit for detection), 1 ppm by weight for bromine, and 1 ppm by weight for chlorine on the respective element bases. Namely, the aqueous solution of tetrabutylammoniumoxide (TBAOH), which was procured from the market, was highly purified to an allowable level of impurities in the present invention.

Then, bis(triethoxysilyl)ethane (BTESE, produced by GELEST), methyltrimethoxysilane (MTMS, produced by Shin-Etsu Chemical Co., Ltd), and ethanol with the concentration of 99.5% by weight (ETOH, produced by Wako Pure Chemical Industries Co., Ltd.) were mixed at the percentages as shown in Table 1, and the mixture solution was preserved at the temperature of 20° C. and agitated for 30 minutes at the rotating speed of 150 rpm.

The aqueous solution of highly purified tetrabutylammoniumhydroxide (containing TBAOH by 10% by weight) was dripped in the mixture solution at the percentage as shown in Table 1 over 10 minutes, and the resultant mixture solution was agitated for one hour at the temperature of 20° C. at the rotating speed of 200 rpm. Then, the mixture solution was heated to the temperature as shown in Table 1 and agitated for 20 hours at the temperature and at the rotating speed of 200 rpm to hydrolyze the components for forming a silica-based coating film (namely, BTESE and MTMS).

Then, ethanol (namely, organic solvent) in the mixture solution containing hydrolysate of the components for forming a silica-based coating film was subjected to solvent substitution with propyleneglycolmonopropylether (PGP, produced by Nippon Nyukazai Co., Ltd.) by using a rotary evaporator (R-114 produced by Shibata Scientific Technology Ltd.), and then the concentration of the silicon compound comprising hydrolysate of bis(triethoxysilyl)methane (BTESE) and methyltrimethoxysilane (MTMS) was adjusted to obtain the liquid composition containing the silicon compound by 6% by weight in terms of $SiO_2$ (namely, Example coating liquid (4)).

5 ml of the coating liquid for forming a coating film obtained as described above was applied to a silicon wafer substrate (namely, semiconductor substrate) having the size of 8 inches in diameter by the spin coating method under the same conditions as those employed in Example 1.

Then, under the same conditions as those in Example 1, this substrate was heated and cured. Furthermore, the thus obtained substrate (namely, Example substrate (4)) is cooled to a temperature close to the room temperature, and then was taken out to the outside.

The thickness of the silica-based coating film formed on the Example substrate (4) was about 500 nm.

Then, a specific dielectric constant, changes in the water-vapor adsorption rate before and after irradiation of oxygen plasma, a film strength, a surface roughness, and X-ray diffraction peaks of the silica-based coating film formed on the Example substrate (4) were measured by the methods as described in Example 1. The results of the measurement are shown in Table 2.

Example 5

Bis(triethoxysilyl)ethane (BTESE, produced by GELEST), methyltrimethoxysilane (MTMS, produced by Shin-Etsu Chemical Co., Ltd), tetraethylorthosilicate (TEOS, produced by Tama Chemical Industries Corp.), and ethanol (ETOH, produced by Wako Pure Chemical Industries Co., Ltd.) with the concentration of 99.5% by weight were mixed at the percentages as shown in Table 1, and the mixture solution was preserved at the temperature of 20° C. and agitated for 30 minutes at the rotating speed of 150 rpm.

The aqueous solution of highly purified tetrapropylammoniumhydroxide (containing TPAOH by 10% by weight) was dripped in the mixture solution over 10 minutes at the percentages as shown in Table 1, and the resultant mixture solution was agitated for one hour at the temperature of 20° C. and at the rotating speed of 200 rpm. Then, the mixture solution was heated to the temperatures as shown in Table 1, and under the temperatures, the mixture solution was agitated for 20 hours at the rotating speed of 200 rpm to hydrolyze the silicon components for forming a silica-based coating film (namely, BTESE, MTMS, and TEOS).

Then, ethanol (namely, organic solvent) in the mixture solution containing hydrolysate of the components for forming a silica-based coating film was subjected to solvent substitution with propyleneglycolmonopropylether (PGP, Nippon Nyukazai Co., Ltd.) by using a rotary evaporator (R-114 produced by Shibata Scientific Technology Ltd.), and a concentration of the silicon compounds comprising hydrolysate of bis(triethoxysilyl)ethane (BTESE), methyltrimethoxysilane (MTMS), and tetraethylorthosilicate (TEOS) to obtain the liquid compounds containing the silicon compound by 6% by weight in terms of $SiO_2$ (namely, Example coating liquids (5)-1 to (5)-3).

Of these materials, the Example coating liquid (5)-2 was selected, and a number average molecular weight of the silicon compound containing in the liquid composition was measured by the liquid chromatography method, and found that the number average molecular weight was about 17,000 in terms of polyethyleneoxide.

5 ml of the coating liquid for forming a coating film obtained as described above was applied to a silicon wafer substrate (namely, semiconductor substrate) having the size of 8 inches in diameter by the spin coating method under the same conditions as those employed in Example 1.

Then, under the same conditions as those in Example 1, these substrates were heated and cured. Furthermore, the thus obtained substrates (namely, Example substrates (5)-1 to (5)-3) were cooled to a temperature close to the room temperature, and then were taken out to the outside.

The thickness of each silica-based coating film formed on the Example substrates (5)-1 to (5)-3 was about 500 nm.

Then, a specific dielectric constant, changes in the water-vapor adsorption rate before and after irradiation of oxygen plasma, a film strength, a surface roughness, and X-ray diffraction peaks of each silica-based coating film formed on the Example substrates (5)-1 to (5)-3 were measured by the methods as described in Example 1. The results of the measurement are shown in Table 2.

Example 6

5 ml of Example coating liquid (2)-2 prepared in Example 2 was applied on a silicon wafer substrate (namely, semiconductor substrate) with the size of 8 inches in diameter, under the same conditions as those employed in Example 1 by the spin coating method.

Then, the substrate was placed on a sheet-fed hot plate, and was heated at the temperature of 150° C. for 3 minutes in the nitrogen atmosphere. During the heating step, such components as the organic solvent (PGP) contained in the coating film were evaporated or vaporized, and the evaporated or vaporized components were discharged to the outside.

Furthermore, in the state where the substrate was placed on the sheet-fed hot plate, the substrate was cured by irradiating an electron beam at the temperature of 300° C. in the nitrogen atmosphere. The voltage for application of the electron beam was 13 kV, and the exposure dose was 500 $\mu C/cm^2$. Then, the thus obtained substrate (namely, Example substrate (6)) was cooled to a temperature close to the room temperature and then was taken out to the outside.

The thickness of the silica-based coating film formed on the substrate was about 500 nm.

Then, a specific dielectric constant, changes in the water-vapor adsorption rate before and after irradiation of oxygen plasma, a film strength, a surface roughness, and X-ray diffraction peaks of the silica-based coating film formed on the substrate were measured by the methods as described in Example 1. The results of the measurement are shown in Table 2.

Comparative Example 1

20.0 g of triethoxysilane (TEOS produced by Shin-Etsu Chemical Co., Ltd), 39.77 g of methyltrimethoxysilane (MTMS produced by Shin-Etsu Chemical Co., Ltd), and ethanol with the concentration of 99.5% by weight (ETOH, Wako Pure Chemical Industries Co., Ltd.) were mixed, and 500 g of the mixture solution was preserved at the temperature of 20° C. Then, 45 g of an aqueous solution containing nitric acid by 0.05% by weight was added to the mixture solution, and the resultant mixture solution was agitated for 30 minutes at the rotating speed of 150 rpm. Then, the solution was heated to the temperature of 20° C. and was agitated at the temperature and at the rotating speed of 200 rpm for one hour to hydrolyze the components for forming a silica-based coating film (namely, TEOS and MTMS).

Then, ethanol (namely, organic solvent) in the mixture solution containing hydrolysate of the components for forming a silica-based coating film was subjected to solvent substitution with propyleneglycolmonopropylether (PGP produced by Nippon Nyukazai Co., Ltd.) by using a rotary evaporator (R-114 produced by Shibata Scientific Technology Ltd.), and a concentration of the silicon compound comprising hydrolysate of the tetraethylorthosilicate (TEOS) and methyltrimethoxysilane (MTMS) was adjusted to obtain a liquid composition containing the silicon compound by 6% by weight in terms of $SiO_2$.

Furthermore, a PGP mixture solution was prepared by dissolving 3.75 g of acrylic resin with a number average molecular weight of 22,190 (produced by Mitsubishi Rayon Corp.) in 15 g of the propyleneglycolmonopropylether, and also a PGP mixture solution was prepared by dissolving 7.5 g of the acrylic resin in 15 g of the propyleneglycolmonopropylether. Then, 125 g of the liquid composition was mixed in the PGP mixture solutions respectively to obtain coating liquids for forming a coating film (namely, Comparative Example coating liquids (1)-1 and (1)-2).

5 ml of the coating liquid for forming a coating film obtained as described above was applied on a silicon wafer substrate (namely, semiconductor substrate) with the size of 8 inches in diameter by the spin coating method under the same conditions as those employed in Example 1.

Then, under the same conditions as those in Example 1, these substrates were heated and cured. Furthermore, the thus obtained substrates (namely, Comparative Example substrates (1)-1 to (1)-2) were cooled to a temperature close to the room temperature, and then were taken out to the outside.

The thickness of each silica-based coating film formed on the Comparative Example substrates (1)-1 to (1)-2 was about 500 nm.

Then, a specific dielectric constant, changes in the water-vapor adsorption rate before and after irradiation of oxygen plasma, a film strength, a surface roughness, and X-ray diffraction peaks of the silica-based coating film formed on the Comparative Example substrates (1)-1 to (1)-2 were measured by the methods as described in Example 1. The results of the measurement are shown in Table 2.

Comparative Example 2

Bis(triethoxysilyl)ethane (BTESE, produced by GELEST), methyltrimethoxysilane (MTMS, produced by Shin-Etsu Chemical Co., Ltd), and ethanol with the concentration of 99.5% by weight (ETOH, Wako Pure Chemical Industries Co., Ltd.) were mixed at such percentages as used respectively in the preparation of the Example coating liquid (2)-2, and the mixture solution was preserved at 20° C. and agitated for 30 minutes at the rotating speed of 150 rpm.

The aqueous solution of highly purified tetrapropylammoniumhydroxide (containing TPAOH by 10% by weight) was dripped in the mixture solution over 10 minutes at such percentage as used in the preparation of the Example coating liquid (2)-2, and the resultant mixture solution was agitated for one hour at 20° C. and at the rotating speed of 200 rpm.

Then, the mixture solution was heated to 30° C. and agitated at the temperature for 20 hours and at the rotating speed of 200 rpm to hydrolyze the components for forming a silica-based coating film (namely, BTESE and MTMS). However, the hydrolysis reaction did not proceed smoothly under the condition of the temperature, and the components were not hydrolyzed sufficiently.

Then, ethanol (namely, organic solvent) in the mixture solution containing hydrolysate of the components for forming a silica-based coating film was subjected to solvent substitution with propyleneglycolmonopropylether (PGP, produced by Nippon Nyukazai Co., Ltd.) by using a rotary evaporator (R-114 produced by Shibata Scientific Technology Ltd.), and then a concentration of the silicon compound comprising hydrolysate of bis(triethoxysilyl)ethane (BTESE) and methyltrimethoxysilane (MTMS) was adjusted to obtain the liquid composition containing the silicon compound by 6% by weight in terms of $SiO_2$ (namely, Comparative Example coating liquid (2)).

Then, like in Example 1, a number average molecular weight of the silicon compound contained in the liquid composition for Comparative Example coating liquid (2) was measured by the liquid chromatography method, and found that the number average molecular weight was about 2,000 in terms of polyethyleneoxide.

5 ml of the coating liquid for forming a coating film obtained as described above was applied on a silicon wafer substrate (semiconductor substrate) with the size of 8 inches in diameter by the spin coating method under the same conditions as those employed in Example 1.

Then, under the same conditions as those in Example 1, the substrate was heated and cured. Furthermore, the thus obtained substrate (namely, Comparative Example substrates (2)) was cooled to a temperature close to the room temperature, and then was taken out to the outside.

The thickness of the silica-based coating film formed on the Comparative Example substrates (2) was about 500 nm.

Then, a specific dielectric constant, changes in the water-vapor adsorption rate before and after irradiation of oxygen plasma, a film strength, a surface roughness, and X-ray diffraction peaks of the silica-based coating film formed on the Comparative Example substrates (2) were measured by the methods as described in Example 1. The results of the measurement are shown in Table 2.

Comparative Example 3

Bis(triethoxysilyl)ethane (BTESE, produced by GELEST), methyltrimethoxysilane (MTMS, produced by Shin-Etsu Chemical Co., Ltd), and ethanol with the concentration of 99.5% by weight (ETOH, Wako Pure Chemical Industries Co., Ltd.) were mixed at such percentages as used respectively in the preparation of the Example coating liquid (2)-2, and the mixture solution was preserved at the temperature of 20° C. and agitated for 30 minutes at the rotating speed of 150 rpm.

The aqueous solution of highly purified tetrapropylammoniumhydroxide (containing TPAOH by 10% by weight) was dripped in the mixture solution over 10 minutes at the percentage as used in the preparation of the Example coating liquid (2)-2, and the resultant mixture solution was agitated for one hour at the temperature of 20° C. and at the rotating speed of 200 rpm.

Then the mixture solution was heated to the temperature of 90° C. to hydrolyze the components for forming a silica-based coating film (namely, BTESE and MTMS), but ethanol evaporated so much, and therefore the testing was stopped.

In this Comparative Example, like in the Examples as described above, a separable flask made from quarts was used as a reaction vessel, and a testing was further conducted experimentally with an autoclave (namely, a pressure-proof sealed vessel). By using a coating liquid thus obtained, a silica-based coating film was formed on a substrate, and it was found that a surface roughness (Rms) of the coating film was 2.0 nm or more, which indicates a possibility of partial crystallization of the silicon compound in the coating film.

TABLE 1

| | | Example coating liquids No. | | | | | |
|---|---|---|---|---|---|---|---|
| | | (1)-1 | (1)-2 | (1)-3 | (2)-1 | (2)-2 | (2)-3 |
| Materials used for preparation | BTESM (g) | 25 | 35 | 20 | — | — | — |
| | BTESE (g) | — | — | — | 10 | 30 | 22.5 |
| | MTMS (g) | 20 | 12 | 16 | 7.7 | 34.7 | 40.2 |
| | MTES (g) | — | — | — | — | — | — |
| | TEOS (g) | — | — | — | — | — | — |
| | TPAOH (g) | 239 | 240 | 240 | 91 | 174 | 340 |
| | TBAOH (g) | — | — | — | — | — | — |
| | Ethanol (g) | 100 | 100 | 100 | 39 | 147 | 147 |
| Molar ratio of BTASA/AS in terms of $SiO_2$ | | 5/5 | 7/3 | 5/5 | 5/5 | 4/6 | 3/7 |
| Molar ratio of (BTASA + AS)/TAOS in terms of $SiO_2$ | | — | — | — | — | — | — |
| Molar ratio of TAAOH/(BTASA + AS) or TAAOH/(BTASA + AS + TAOS) in terms of $SiO_2$ | | 4/10 | 4/10 | 5/10 | 4/10 | 2/10 | 4/10 |
| Temperature for hydrolysis reaction (° C.) | | 45 | 50 | 60 | 60 | 70 | 75 |
| Content of each component | Silicon compound (Wt %) | 6 | 6 | 6 | 6 | 6 | 6 |
| | Water (Wt %) | 14 | 24 | 34 | 44 | 4 | 0.5 |
| | Organic solbent (Wt %) | 80 | 70 | 60 | 50 | 90 | 93.5 |

| | | Example coating liquids No. | | | | | |
|---|---|---|---|---|---|---|---|
| | | (3)-1 | (3)-2 | (4) | (5)-1 | (5)-2 | (5)-3 |
| Materials used for preparation | BTESM (g) | — | — | — | — | — | — |
| | BTESE (g) | 52.5 | 10 | 22.5 | 18 | 14 | 10 |
| | MTMS (g) | — | — | 40.2 | 20.7 | 16 | 11.6 |
| | MTES (g) | 22.5 | 10 | — | — | — | — |
| | TEOS (g) | — | — | — | 5.9 | 17.5 | 29.5 |
| | TPAOH (g) | 340 | 137 | — | 230 | 230 | 230 |
| | TBAOH (g) | — | — | 329 | — | — | — |
| | Ethanol (g) | 147 | 39 | 147 | 98 | 98 | 98 |
| Molar ratio of BTASA/AS in terms of $SiO_2$ | | 7/3 | 5/5 | 3/7 | 4/6 | 4/6 | 4/6 |
| Molar ratio of (BTASA + AS)/TAOS in terms of $SiO_2$ | | — | — | — | 9/1 | 7/3 | 5/5 |
| Molar ratio of TAAOH/(BTASA + AS) or TAAOH/(BTASA + AS + TAOS) in terms of $SiO_2$ | | 4/10 | 6/10 | 3/10 | 4/10 | 4/10 | 4/10 |
| Temperature for hydrolysis reaction (° C.) | | 45 | 50 | 60 | 70 | 75 | 60 |
| Content of each component | Silicon compound (Wt %) | 6 | 6 | 6 | 6 | 6 | 6 |
| | Water (Wt %) | 44 | 34 | 24 | 14 | 4 | 24 |
| | Organic solbent (Wt %) | 50 | 60 | 70 | 80 | 90 | 70 |

The abbreviations as described in Table 1 shall read as bis(ethoxysilyl)methane for BTESM, bis(ethoxysilyl)ethane for BTESE, methyltrimethoxysilane for MTMS, methyltriethoxysilane for MTES, tetraethoxyorthosilicate for TEOS, tetrapropylammoniumhydroxide for TPAOH, and tetrabutylammoniumhydroxide for TBAOH. Furthermore, the abbreviations as described herein shall read as bis(trialkoxysilyl)alkane for BTASA which represents BTESM or BTESE, alkoxysilane for AS which represents MTMS or MTES, tetraalkylorthosilicate for TAOS which represents TEOS, and tetraalkylammoniumhydroxide for TAAOH which represents TPAOH or TBAOH.

TABLE 2

| Example substrates No. | Comparative Example substrates No. | Specific dielectric constant | Changes in the water-vopor adsorption rate after irradiation of oxygen plasma | Film strength (Young's modulus) (Gpa) | Surface roughness (Rms) (nm) | X-ray diffraction peak (Crystalline or amorphous) |
|---|---|---|---|---|---|---|
| (1)-1 | | 2.5 | no change | 7 | 0.3 | amorphous |
| (1)-2 | | 2.8 | no change | 10 | 0.2 | amorphous |
| (1)-3 | | 2.3 | no change | 5 | 0.5 | amorphous |
| (2)-1 | | 2.2 | no change | 5 | 0.7 | amorphous |
| (2)-2 | | 2.0 | no change | 4 | 0.8 | amorphous |
| (2)-3 | | 1.9 | no change | 4 | 0.8 | amorphous |
| (3)-1 | | 2.9 | no change | 10 | 0.2 | amorphous |
| (3)-2 | | 2.6 | no change | 8 | 0.3 | amorphous |
| (4) | | 2.3 | no change | 5 | 0.5 | amorphous |
| (5)-1 | | 2.0 | no change | 5 | 0.7 | amorphous |
| (5)-2 | | 2.3 | no change | 7 | 0.5 | amorphous |
| (5)-3 | | 3.0 | no change | 12 | 0.3 | amorphous |
| (6) | | 2.2 | no change | 7 | 0.5 | amorphous |
| | (1)-1 | 2.2 | increased | 2 | 1.5 | amorphous |
| | (1)-2 | 2 | increased | 1 | 2.0 | amorphous |
| | (2) | 3 | no change | 2 | 1.5 | amorphous |

The invention claimed is:

1. A coating liquid for forming a low dielectric constant amorphous silica-based coating film which has smoothness of its surface, a high film strength and an excellent hydrophobicity, the coating liquid comprising:

a silicon compound obtained by hydrolyzing bis(trialkoxysilyl)alkane (BTASA) and alkoxysilane (AS) the presence of tetraalkylammoniumhydroxide (TAAOH) at a temperature in the range from 40 to 80° C., the molar ratio of BTASA:AS being in the range 49-9:21 in terms of $SiO_2$ and the molar ratio of TAAOH:(BTASA+AS) being in the range 1-6:10 in terms of $SiO_2$, wherein the weight ratio of TAAOH to the coating liquid is from 4.1 to 12.2 weight percent, wherein the bis(trialkoxysilyl)alkane (BTASA) is bis(trimethoxysilyl)methane (BTMSM), bis(triethoxysilyl)methene (BTESM), bis(trimethoxysilyl)ethane (BTMSE), bis(triethoxysilyl)ethane (BTESE), or a mixture thereof;

wherein the alkoxysilane (AS) is methyltrimethoxysilane (MTMS), methyltriethoxysilane (MTES), or a mixture thereof; and wherein the tetraalkylammoniumhydroxide (TAAOH) is tetrapropylammoniumhydroxide (TPAOH), tetrabutylammoniumhydroxide (TBAOH), or a mixture thereof.

2. The coating liquid according to claim 1, wherein the tetraalkylammonium hydroxide (TAAOH) contains impurities comprising compounds of alkali metal elements including sodium (Na) and potassium (K), by 50 ppb by weight or below on the respective element bases.

3. The coating liquid according to claim 1, wherein the tetraalkylammoniumhydroxide (TAAOH) contains impurities comprising compounds of halogen group elements including bromine (Br) and chlorine (Cl), by 1 ppm by weight or below on the respective element bases.

4. The coating liquid according to claim 1, wherein the silicon compound has a number average molecular weight being in the range from 3,000 to 70,000 in terms of polyethyleneoxide.

5. The coating liquid according to claim 1, wherein the coating liquid contains a silicon compound obtained by hydrolyzing the bis(trialkoxysilyl)alkane (BTASA) and the alkoxysilane (AS), in the range from 1 to 20% by weight, and other components contained therein are substantially water and an organic solvent.

6. The coating liquid according to claim 5, wherein the organic solvent is propyleneglycolmonopropylether (PGP), propyleneglycolmonomethylether (PGME), or propyleneglycolmonomethyletheracetate (PGMEA).

7. A low dielectric constant amorphous silica-based coating film obtained by coating the coating liquid according to claim 1 on a substrate, heating the substrate at a temperature in the range from 80 to 350° C., and then curing the substrate at a temperature higher than the heating temperature in the range from 340 to 450° C.

8. The coating film according to claim 7, wherein the coating film has a dielectric constant of 3.0 or below and a film strength with Young's modulus of 3.0 GPa or more.

9. The coating film according to claim 7, wherein the coating film has a smooth surface with a surface roughness (Rms) of 1.0 nm or below.

10. The coating film according to claim 7, wherein the coating film is an amorphous silica-based coating film not having X-ray diffraction peaks showing the MFI crystal structure.

11. The coating film according to claim 7, wherein the coating film is an interlayer insulating film formed on a semiconductor substrate.

12. A low dielectric constant amorphous silica-based coating film obtained by coating the coating liquid according to claim 1 on a substrate, heating the substrate at a temperature in the range from 80 to 350° C., and then curing the substrate by irradiating electron beam, ultraviolet radiation or microwave.

13. A coating liquid for forming a low dielectric constant amorphous silica-based coating film which has smoothness of its surface, a high film strength and an excellent hydrophobicity, the coating liquid comprising:

a silicon compound obtained by hydrolyzing bis(trialkoxysilyl)alkane (BTASA) alkoxysilane (AS) and tetraethylorthosilicate (TEOS) in the presence of tetraalkylammoniumhydroxide (TAAOH) at a temperature in the range from 40 to 80° C., the molar ratio of BTASA:AS being in the range 49-9:21 in terms of $SiO_2$, the molar ratio of (BTASA+AS):TEOS being in the range 99-1:1 in terms of $SiO_2$ and the molar ratio of TAAOH:(BTASA+AS+TEOS) being in the range 1-6:10 in terms of $SiO_2$, wherein the weight ratio of TAAOH to the coating liquid is from 8.1 to 8.2 weight percent, wherein the bis(trialkoxysilyl)alkane (BTASA) is bis(trimethoxysilyl)methane (BTMSM), bis(triethoxysilyl)methane (BTESM), bis(trimethoxysilyl)ethane (BTMSE), bis(triethoxysilyl)ethane (BTESE), or a mixture thereof;

wherein the alkoxysilane (AS) is methyltrimethoxysilane (MTMS), methyltriethoxysilane (MTES), or a mixture thereof; and wherein the tetraalkylammoniumhydroxide (TAAOH) is tetrapropylammoniumhydroxide (TPAOH), tetrabutylammoniumhydroxide (TBAOH), or a mixture thereof.

14. The coating liquid according to claim 13, wherein the coating liquid contains a silicon compound obtained by hydrolyzing the bis(trialkoxysilyl)alkane (BTASA), the alkoxysilane (AS) and the tetraethylorthosilicate (TEOS), in the range from 1 to 20% by weight, and other components contained therein are substantially water and an organic solvent.

* * * * *